(12) United States Patent
Kling et al.

(10) Patent No.: US 6,586,308 B2
(45) Date of Patent: Jul. 1, 2003

(54) METHOD FOR PRODUCING CIRCUIT STRUCTURES ON A SEMICONDUCTOR SUBSTRATE AND SEMICONDUCTOR CONFIGURATION WITH FUNCTIONAL CIRCUIT STRUCTURES AND DUMMY CIRCUIT STRUCTURES

(75) Inventors: Sabine Kling, München (DE); Dominique Savignac, Ismaning (DE); Hans-Peter Moll, Dresden (DE); Henning Haffner, Dresden (DE); Elke Hietschold, Dresden (DE); Ines Anke, Dresden (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/981,856

(22) Filed: Oct. 18, 2001

(65) Prior Publication Data

US 2002/0061614 A1 May 23, 2002

(30) Foreign Application Priority Data

Oct. 18, 2000 (DE) .......................................... 100 51 719

(51) Int. Cl.$^7$ .............................................. H01L 21/20
(52) U.S. Cl. ....................................... 438/378; 438/947
(58) Field of Search ................................ 438/183, 378, 438/321, 430, 311, 947; 257/903, 238, 239, 399

(56) References Cited

U.S. PATENT DOCUMENTS

| 5,278,105 A | 1/1994 | Eden et al. |
| 5,793,087 A | 8/1998 | Chevallier |
| 5,862,072 A | 1/1999 | Raad et al. |
| 5,885,856 A | 3/1999 | Gilbert et al. |
| 5,946,230 A | 8/1999 | Shimizu et al. |
| 6,165,692 A | * 12/2000 | Kanai et al. ................. 430/311 |
| 6,373,544 B1 | * 4/2002 | Hirabayashyi ............... 349/149 |
| 6,376,884 B1 | * 4/2002 | Hotta .......................... 257/379 |
| 6,380,578 B1 | * 4/2002 | Kunikiyo .................... 257/301 |

FOREIGN PATENT DOCUMENTS

| EP | 0 369 427 A2 | 5/1990 |
| EP | 0 940 817 A2 | 2/1999 |
| EP | 0 903 635 A2 | 3/1999 |
| JP | 04307969 A | 10/1992 |
| JP | 2001326429 A | * 11/2001 |

* cited by examiner

Primary Examiner—Long Pham
Assistant Examiner—Dana Farahani
(74) Attorney, Agent, or Firm—Laurence A. Greenberg; Werner H. Stemer; Ralph E. Locher

(57) ABSTRACT

A method for producing circuit structures on a semiconductor substrate is described. Photoresist structures are formed, which define functional circuit structures and dummy circuit structures, whereby the dummy circuit structures which are smaller than a minimum structural size are joined to an additional second dummy circuit structure. The additional circuit structure is provided in such a way that the minimum structural size, which is determined by a smallest required joint surface of the photoresist on the substrate, is exceeded. A semiconductor circuit is also provided, which includes functional circuit structures and dummy circuit structures, the dummy circuit structures being joined to the additional dummy circuit structures.

6 Claims, 2 Drawing Sheets

METHOD FOR PRODUCING CIRCUIT STRUCTURES ON A SEMICONDUCTOR SUBSTRATE AND SEMICONDUCTOR CONFIGURATION WITH FUNCTIONAL CIRCUIT STRUCTURES AND DUMMY CIRCUIT STRUCTURES

BACKGROUND OF THE INVENTION

Field of the Invention

The invention relates to a method for producing circuit structures on a semiconductor substrate with the aid of a lithography process. Photoresist structures are formed on the semiconductor substrate in order to define dummy circuit structures. The invention also relates to a semiconductor configuration with functional circuit structures and dummy circuit structures produced with the aid of the lithography process.

A lithography process is usually utilized to produce circuit structures on a semiconductor substrate. The lithography process essentially includes the structuring of a masking layer, commonly $SiO_2$, through a structured photoresist. In order to produce the structured photoresist, the resist is applied to the masking layer and then exposed and developed through an exposure mask, so that photosensitive structures remain on the masking layer. The photoresist structures cover particular regions of the masking layer and leave exposed regions, in which the masking layer is accessible for a subsequent etching step by which the masking layer is structured.

The exposure of the photoresist in the lithography process is usually performed optically. As the smallest structures on the structured semiconductor substrate grow increasingly smaller, there are increasingly greater problems accurately reproducing the structures that are present on an exposure mask on a photosensitive layer. Because the structures on the exposure mask exhibit orders of magnitude in the range of the wavelength of the exposure radiation with which the resist is exposed, more intense diffraction effects occur at the margins of the structures. In particular, when the structures are disposed in regular patterns, the diffraction effects in the optical imaging through a diffraction grid on the exposure mask, which is formed by the structures, plays a significant role.

In order to purposefully control consequent deviations in the structure formation, dummy structures are usually provided, which are substantially without electrical function but which influence the characteristics of neighboring functional circuit structures in the production of the circuit. The dummy structures are provided predominantly in the margin region of field configuration of circuit structures, so that during production the functional circuit structures find the same environmental conditions at the margin as in the interior of the field.

SUMMARY OF THE INVENTION

It is accordingly an object of the invention to provide a method for producing circuit structures on a semiconductor substrate and a semiconductor configuraition with functional circuit structures and dummy circuit structures which overcome the above-mentioned disadvantages of the prior art methods of and devices of this general type, which has improved dummy circuit structures.

With the foregoing and other objects in view there is provided, in accordance with the invention, a method for producing circuit structures with an aid of a lithography process. The method includes the steps of providing a semiconductor substrate; forming photoresist structures on the semiconductor substrate to define dummy circuit structures; and forming further dummy circuit structures. Each of the further dummy circuit structures joins one of the dummy circuit structures that is smaller than a prescribed minimum size so that the prescribed minimum size is exceeded, the prescribed minimum size is determined by a smallest required adhering surface for photoresist forming the photoresist structures to adhere to the semiconductor substrate.

The dummy circuit structures can be very small in certain circuit structures, because it is frequently sufficient for purposes of avoiding margin-related deviations to place only parts of the circuit structures at the margin of a field configuration. But the result of this is that some of the dummy structures are smaller than the structures provided for the circuit structure, and the size of the dummy structures moves into dimensions in the range of the minimum structural size. When such small structures are structured with the aid of the lithography process, complications arise with the photosensitive masks. Specifically, the photoresist masks must be very small given small dummy structures, since the dummy circuit structures must be masked by correspondingly small photoresist structures when being produced by a lithography process.

The photoresist on the masking layer has only a limited adhesive power, and detachment from the masking layer can occur during production given very small photoresist structures. This causes the removal of the photoresist structures and/or their displacement to another location of the photoresist mask, which results in the covering of a region of the masking layer with respect to a subsequent step in which it should actually be uncovered. In all probability, this will substantially impair the functioning of the circuit, because, on one hand, given the omission of a dummy circuit structure, the function of the respective circuit structure at the margin may be impaired, or on the other hand, shorts or the like may occur if the photoresist structure is shifted to another location of the photoresist mask. The danger of detachment of the photoresist structure exists particularly when the joint surface of the photoresist structure is below a minimum structural size. The minimum structural size is defined by the area of the joint between the masking layer and be the photoresist layer given that the photoresist layer reliably adheres to the masking layer.

It is therefore inventively provided that the dummy circuit structure that is below the minimum structural size is joined to an additional dummy circuit structure, so that the minimum structural size is exceeded. This prevents the formation of photoresist structures of less than minimum structural size on the semiconductor substrate during the production process. The photoresist structure is thus prevented from detaching and moving to other regions of the semiconductor substrate, where it could impair the electrical function of the functional circuit structures.

According to an added mode of the invention, there is the step of joining one of the further dummy circuit structures to a respective one of the dummy circuit structures using a bridge structure.

With the foregoing and other objects in view there is further provided, in accordance with the invention, a semiconductor configuration. The semiconductor configuration contains a semiconductor substrate, functional circuit structures disposed on the semiconductor substrate, and dummy circuit structures including first dummy circuit structures and second dummy circuit structures produced with an aid of a lithography process and disposed on the semiconductor substrate. Each of the first dummy circuit structures is joined to one of the second dummy circuit structures so that a minimum structural size is exceeded. The first dummy circuit structures are smaller than the minimum structural size, the minimum structural sized is determined by a smallest required adhering surface of photoresist utilized in the lithography process to adhere onto the semiconductor substrate.

According to an expedient embodiment, it can be provided that the joined dummy circuit structure is formed of two dummy circuit structures, each of which is smaller than the prescribed minimum size. The advantage of this is that the joined dummy structure can be kept optimally small, since the required minimum structural size is usually already achieved or exceeded by joining small dummy circuit structures. An optimally small joined dummy circuit structure is advantageous, since this also exerts an influence on the production of neighboring structures which may be adverse and should therefore by minimized.

According to another embodiment of the invention, it is provided that the functional circuit structures are disposed in a field, and that the dummy circuit structure is disposed at a margin of the field. The advantage of this is that the deviation of the functionality of the functional circuit structures situated at the margin owing to the different neighboring structures can be reduced.

According to another advantageous embodiment, it is provided that the functional circuit structures represent memory cells. With memory cells, in particular, it is necessary that the memory cells exhibit an identical functionality regardless of their position in the cell field. Furthermore, the cells in modern semiconductor memories are highly integrated, with the structural size being in the range of the smallest possible sizes that can be structured, i.e. near the minimum surface area as determined by the photoresist. In order to prevent deviations of the memory cells situated at the margin, it is necessary to provide dummy circuit structures whose surface area is smaller than the minimum surface area at the margin of a field containing the memory cells, because dummy circuit structures at the margin of a field often represent partial structures of the functional circuit structures.

Other features which are considered as characteristic for the invention are set forth in the appended claims.

Although the invention is illustrated and described herein as embodied in a method for producing circuit structures on a semiconductor substrate and a semiconductor configuration with functional circuit structures and dummy circuit structures, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
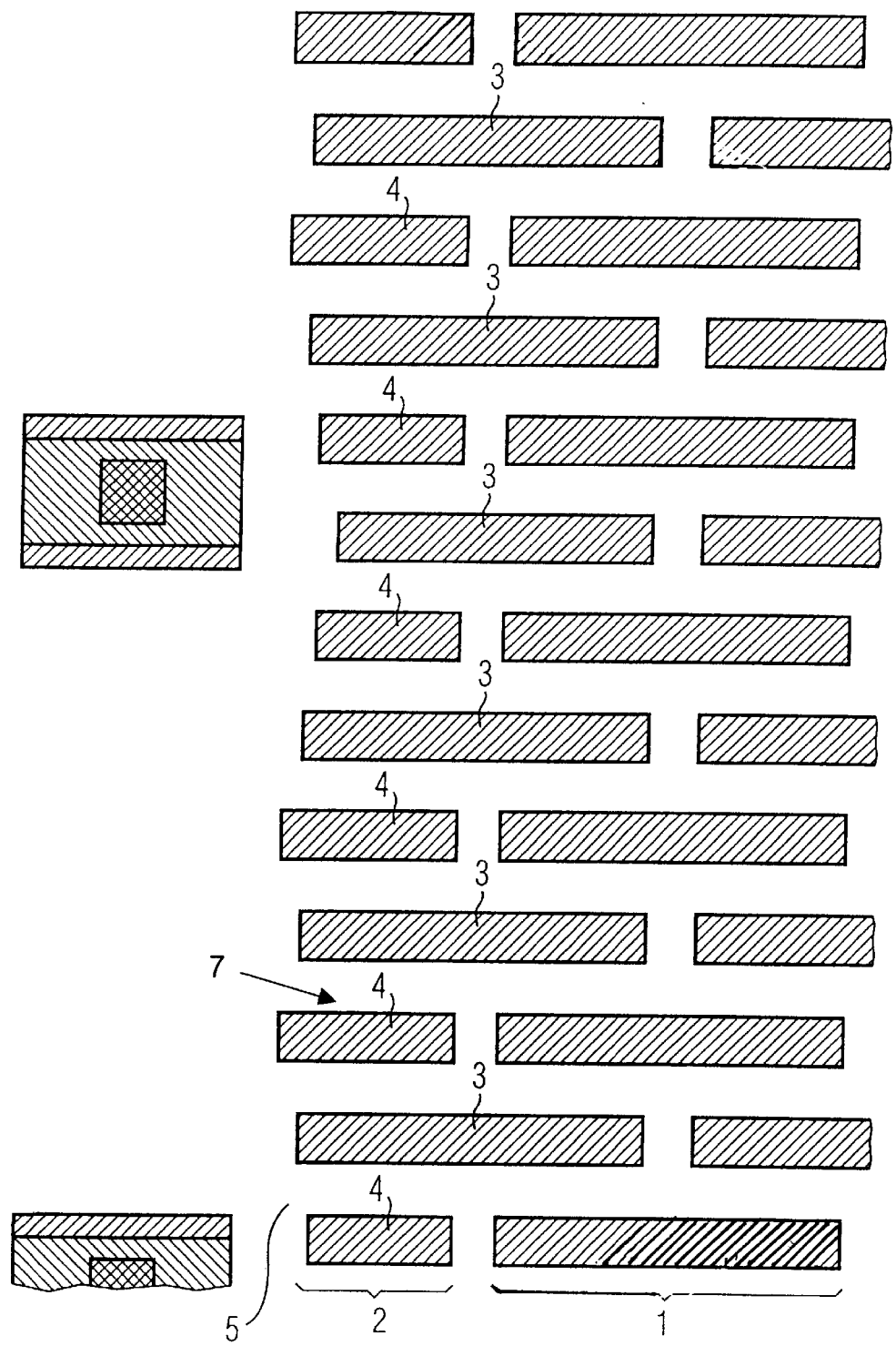
FIG. 1 is a diagrammatic, section view of dummy structures at a margin of a cell field of a memory.

Referring now to the figures of the drawing in detail and first, particularly, to FIG. 1 thereof, there is shown a margin region of a memory cell field 1 in which dummy memory structures 2 are located. The dummy circuit structures 2 continue the cell field 1 in such a way that respective functional memory cells find identical or similar adjoining memory cells. This guarantees that similar conditions exist with respect to adjacent structures in the production of functional memory cells by a lithography process.

Figure 2:
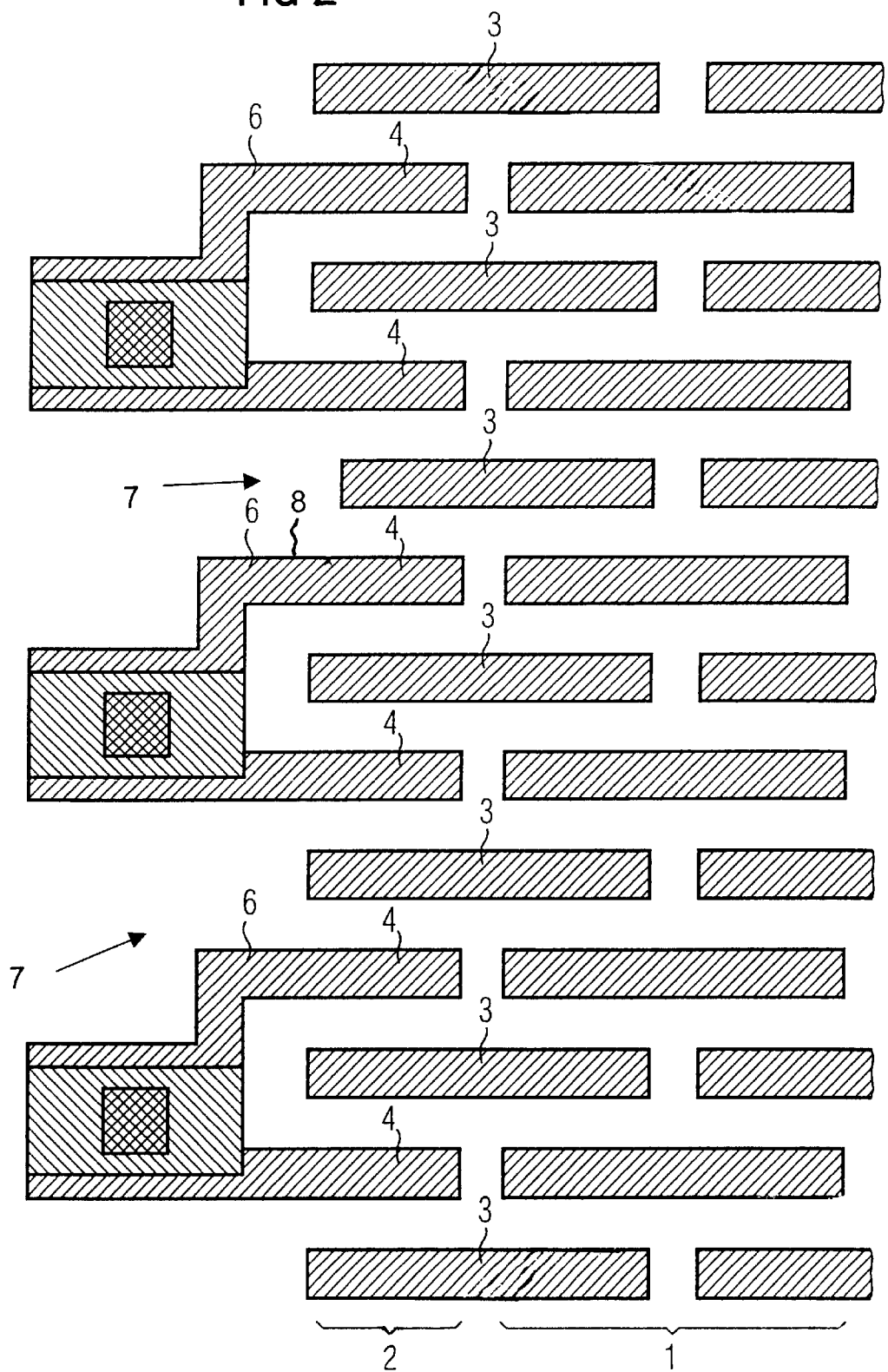
FIG. 2 is a section view of an exemplifying embodiment of the dummy structures according to the invention.

For reasons of simplicity, FIGS. 1 and 2 represent only the active semiconductor regions and the trough contacts of the memory cell field 1. But it goes without saying that the dummy circuit structures 2 can relate to all of the structures which are produced by the lithography process, i.e. oxide layers, word and bit line metallizations, diffusion regions, and so on.

In order to keep the area consumed by the dummy circuit structures 2 as small as possible, different dummy structures including large dummy structures 3 and small dummy structures 4 are disposed in alternation, producing an approximately rectilinear termination. Connected to this is a region with non-illustrated insulation diffusion, which electrically insulates a p-Si trough structure 5, in which the cell field is located, from adjoining regions. Contact regions are disposed within the p-Si trough structure 5 for purposes of contacting, with which a potential of the p-Si trough structures 5 can be defined.

The represented memory cell field 1 and the dummy circuit structures 2 are generally produced with the aid of a lithography process. Here, a masking layer is structured by depositing a photoresist layer and selectively exposing it via an exposure mask. The exposed or unexposed regions are dissolved out, so that the masking mask is uncovered in desired regions, and photoresist residues remain in other regions of the masking mask. Thus structured, the photoresist layer now serves as a mask for the masking layer that will be structured.

The minimum structural sizes that can be produced by the lithography technique are substantially determined by the wavelength of the utilized exposure radiation. Diffraction effects occur particularly in regular structures in the range of the wavelength of the exposure radiation, whereby secondary maxima of the exposure radiation influence the production of neighboring structures. These effects can be kept under control relatively well within the regular memory cell field 1, since the same environmental conditions prevail for each cell. Deviations which can cause a change in the functional capability of the memory cells only occur at the margin of the memory cell field 1. In order to be able to reliably provide memory cells at the margin of a cell field 1 as well, the dummy memory structures 2 are provided, which create the same environmental conditions for the functional memory cells at the margin as prevail in the interior of the memory cell field 1.

The large dummy structures 3 and the small dummy structures 4 are expediently produced together with the functional cell field 1 using the same processing steps. But the problem arises in the production of the small dummy structures 4. During the lithography process for defining the respective regions of the small dummy structures 4, very small photoresist islands emerge, which define the respective region. The photoresist islands have a very small contact surface with an underlying substrate 7, so that a fast adhesion of the photoresist on the substrate 7 cannot be reliably guaranteed. Thus, in the production of the small dummy structures 4, a photoresist island may detach, flip and/or shift into another region during the lithography process. This can significantly impair the functionality of the circuit or destroy the circuit.

To avoid this disadvantage, additional dummy structures 6 can be provided, with which the small dummy structures are joined, as represented in FIG. 2. This prevents the photoresist islands from being able to detach in the production of dummy circuit structures. Joining photoresist islands having excessively small adhesive surfaces to an additional dummy structure 6 as provided in the invention produces a larger common adhesive surface of the photoresist islands on the semiconductor substrate 7.

Expediently, the additional dummy structure 6 is provided in such a way that it does not substantially functionally influence the margin region of the functional memory cell and exerts only a slight influence on the structure of the memory cells in the lithography process. This is realized in FIG. 2 in that the small dummy circuit structure 4 is extended somewhat in the direction of the insulation trough before a connecting bridge 8 is provided. Because the spacing of the additional dummy structure 6 is increased, its influence on the functional circuit structures is reduced. It may also be provided that the additional dummy structures 6 communicate with the contact regions disposed within the p-Si trough structure 5 in order to set the dummy structures at a fixed potential.

The features of the invention disclosed in the above description, the claims and the drawings can, either individually or in random combination, be essential in realizing the invention in its various embodiments.

We claim:

1. A method for producing circuit structures in regular patterns with an aid of a lithography process, which comprises the steps of:

providing a semiconductor substrate;

forming photoresist structures on the semiconductor substrate to define dummy circuit structures in a marginal region of field configurations of the circuit structures;

forming the dummy circuit structures with partial structures of functional circuit structures, when a surface of the dummy circuit structures is smaller than a prescribed minimum size, which is determined by a smallest required surface of a photoresist structure to adhere on the semiconductor substrate; and forming further dummy circuit structures, each of the further dummy circuit structures joining one of the dummy circuit structures that is smaller than the prescribed minimum size so that the prescribed minimum size is exceeded.

2. The method according to claim 1, which comprises joining one of the further dummy circuit structures to a respective one of the dummy circuit structures using a bridge structure.

3. A semiconductor configuration, comprising a semiconductor substrate;

functional circuit structures disposed on said semiconductor substrate, said functional circuit structures having field configurations with a marginal region;

dummy circuit structures formed by photoresist structures on said semiconductor substrate in said marginal region of said field configurations of said functional circuit structures, said dummy circuit structures including partial structures of said functional circuit structures, when a surface of said dummy circuit structures is smaller than a prescribed minimum size, which is determined by a smallest required surface of a photoresist structure to adhere on the semiconductor substrate; and said dummy circuit structures including first dummy circuit structures and second dummy circuit structures produced with an aid of a lithography process and disposed on said semiconductor substrate, each of said first dummy circuit structures joined to one of said second dummy circuit structures so that a minimum structural size is exceeded, said first dummy circuit structures being smaller than the minimum structural size.

4. The semiconductor configuration according to claim 3, including bridge structures, each of said bridge structures joins a respective one of said first dummy circuit structures to a respective one of said second dummy circuit structures.

5. The semiconductor configuration according to claim 3, wherein said functional circuit structures are disposed in a field having margins, and said first dummy circuit structures are disposed in at least one of the margins of said field.

6. The semiconductor configuration according to claim 3, wherein said functional circuit structures are memory cells.

* * * * *